(12) United States Patent
Mine et al.

(10) Patent No.: US 7,242,869 B2
(45) Date of Patent: Jul. 10, 2007

(54) OPTICAL COMPONENT AND OPTICAL TRANSMITTER-RECEIVER FOR USE IN TWO-WAY OPTICAL COMMUNICATION

(75) Inventors: Keiji Mine, Osaka (JP); Hiroshi Nakagawa, Kyoto (JP); Takeshi Isoda, Osaka (JP)

(73) Assignee: Hosiden Corporation, Osaka (JP)

( * ) Notice: Subject to any disclaimer, the term of this patent is extended or adjusted under 35 U.S.C. 154(b) by 856 days.

(21) Appl. No.: 10/436,968

(22) Filed: May 12, 2003

(65) Prior Publication Data

US 2003/0215234 A1 Nov. 20, 2003

(30) Foreign Application Priority Data

May 20, 2002 (JP) ............................ 2002-144738

(51) Int. Cl.
*H04B 10/00* (2006.01)
*G02B 6/26* (2006.01)

(52) U.S. Cl. .................... 398/135; 398/138; 385/15

(58) Field of Classification Search ............. 398/135, 398/136, 138, 139, 33, 36, 39, 89, 31, 88; 385/15, 31, 33, 42, 36, 88

See application file for complete search history.

(56) References Cited

U.S. PATENT DOCUMENTS 6,901,221 B1 * 5/2005 Jiang et al. ................. 398/138

FOREIGN PATENT DOCUMENTS

| JP | H3-5107 | 1/1991 |
|---|---|---|
| JP | 2003-307658 | 10/2003 |
| WO | WO 00/73833 A1 | 12/2000 |

* cited by examiner

*Primary Examiner*—Dalzid Singh
(74) *Attorney, Agent, or Firm*—David N. Lathrop, Esq.; Gallagher & Lathrop

(57) ABSTRACT

A prism 11 is formed which has a first face 11a opposing an end face of an optical fiber 21 and receiving a light-to-be-received from the optical fiber, second and third faces 11b and 11c adjoining opposite ends of the first face 11a at right angles and opposing each other, a fourth face 11d for reflecting the light-to-be-received from the face 11a toward the face 11b, and a fifth face 11e reflecting a light-to-be-transmitted as projected from a light source through the face 11c toward the face 11a. First and second light-to-be-received converging lenses 12 and 13 are disposed on the faces 11a and 11b of the prism 11 and first and second light-to-be-transmitted converging lenses 14 and 15 are disposed on the faces 11a and 11c. The tilt angles $\beta 1$ and $\beta 2$ of the faces 11d and 11e with respect to the optical fiber axis 21a are less than 45°. With this configuration, if the light-to-be-received enters the light-receiving element 22 and the light-emitting element 23 and is reflected by these elements, such reflected light is prevented from returning back into the optical fiber whereby occurrence of far-end crosstalk can be suppressed.

9 Claims, 8 Drawing Sheets

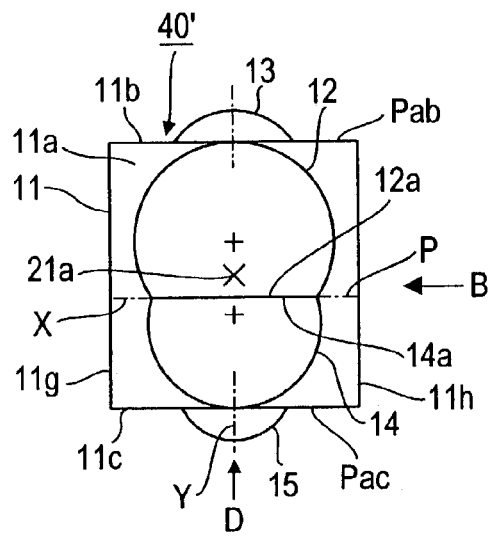

OPTICAL COMPONENT AND OPTICAL TRANSMITTER-RECEIVER FOR USE IN TWO-WAY OPTICAL COMMUNICATION

BACKGROUND OF THE INVENTION

1. Field of the Invention

This invention relates to an optical component for use in two-way optical communication in which transmission and reception of light are effected through a single optical fiber, and an optical transmitter-receiver constructed by the use of the optical component.

2. Description of the Related Art

FIGS. 6A and 6B illustrate a previous optical component (which will be referred to as previous device hereinafter) of the type concerned which has been devised in the factory facilities of the assignee of the present patent application, although not publicly known and from which the present invention originated, and an optical transmitter-receiver constructed by incorporating the component therein together with an optical fiber and light-receiving and light-emitting elements. This previous device will be described below as an example of comparison merely for facilitating of the understanding of the present invention.

In the previous device illustrated, the optical component 10 is constructed by using a prism 11 of pentagular shape (five-sided polygon) in cross-section having first to fifth operative faces 11a-11e which take part in optical transmission and reception. These first to fifth operative faces 11a-11e are all formed perpendicular to the plane of the drawing of FIG. 6A and have respective opposite ends perpendicular to the plane of the drawing. It should be noted, of course, that the prism has end faces 11g and 11h parallel to the plane of the drawing (see FIG. 6B).

One end of the first face 11a of the prism 11 and one end of the second face 11b adjoin each other at a corner Pab such these faces 11a and 11b form a right angle and similarly the other end of the first face 11a and one end of the third face 11c adjoin each other at a corner Pac such these faces 11a and 11c form a right angle. It is thus to be understood that the second face 11b and the third face 11c oppose each other in parallelism.

The other end of the second face 11b of the prism 11 and one end of the fourth face 11d adjoin each other at a corner Pbd, and the other end of the third face 11c and one end of the fifth face 11e adjoin each other at a corner Pce.

Further, the other end of the fourth face 11d and the other end of the fifth face 11e adjoin each other at a corner P, and the fourth face 11d and the fifth face 11e are recessed inwardly from the corners Pbd and Pce toward the first face 11a and form a V-shape as viewed in FIG. 6A. That is, the corner P at which the fourth face 11d and the fifth face 1e adjoin each other is located adjacent the first face 11a closer than the corners Pbd and Pce are.

The first face 11a and the second face 11b of the prism 11 are formed integrally with first and second condensing lens 12 and 13, respectively for light-to-be-received, and further the first face 11a and the third face 11c are formed integrally with first and second condensing lens 14 and 15, respectively for light-to-be-transmitted. In addition, it is to be noted that the first light-to-be-received condensing lens 12 and the first light-to-be-transmitted condensing lens 14 provided on the first face 11a are partially cut away at planes perpendicular to the plane of the drawing such that the cut surfaces of those lens are joined together.

An optical fiber 21 has an end face 21b at its one end located adjacent and in opposition to the lens 12 and 14 formed on the face 11a and has its axis 21a coincide at a point of intersection between a first plane X (shown in a one-dotted chain line in FIG. 6B) passing through the coupled end surfaces (interface) between the first light-to-be-received condensing lens 12 and the first light-to-be-transmitted condensing lens 14 and the corner P and perpendicular to the plane of the drawing of FIG. 6A on one hand and a second plane Y (shown in a one-dotted chain line in FIG. 6B) passing through the centers of the lens 12, 13, 14 and 15 parallel to the plane of the drawing of FIG. 6A and orthogonal to the first plane X on the other hand.

With this arrangement, the upper half portion of the prism 11 located above the first plane X constitutes a receiving path while the lower half portion of the prism 11 located below the first plane X constitutes a transmitting path.

A light-receiving element 22 is positioned in opposition to the lens 13 on the face 11b with its center A22 aligned with the central axis A13 of the lens 13 while a light-emitting element 23 is positioned in opposition to the lens 15 on the face 11c with its center A23 aligned with the central axis A15 of the lens 15. It is also to be noted that the light-receiving element 22 and the light-emitting element 23 are oppositely positioned in parallel.

In this example, the light-receiving element 22 and the light-emitting element 23 are both mounted on a reed frame 24 and resin-encapsulated in transparent resin. In the drawing, 24 indicates the reed frame and 25 an encapsulating resin. This encapsulating resin has a lens portion 25a. The light-emitting element 23 may be a laser diode (LD) or a light-emitting diode (LED), for example, and the light-receiving element 22 may be a photodiode (PD), for example.

As shown in FIG. 6A, a light 31 to be received which has been emitted from the end face 21b of the optical fiber 21 is condensed through the light-to-be-received condensing lens 12 prior to entering the prism 11 through the face 11a and is then reflected by the face 11d to be directed at the face 11b, followed by being condensed through the light-to-be-received condensing lens 13 before entering the light-receiving element 22. In this regard, the lens portion 25a of encapsulating resin aids the light-receiving element in condensing the light.

On the other hand, a light 32 to be transmitted which has been emitted from the light-emitting element 23 is condensed by the light-to-be-transmitted condensing lens 15 prior to entering the prism 11 through the face 11c and is then reflected by the face 1e to be directed at the face 11a, followed by being condensed through the light-to-be-transmitted condensing lens 14 before entering the end face 21b of the optical fiber 21.

It is thus to be appreciated that in the illustrated example the arrangement is such that transmission and reception of light is effected through a single optical component 10.

It should be here appreciated that in this type of optical component in charge of both transmission and reception of light, crosstalk is a great concern with respect to its performance and that it is a significant problem to suppress the crosstalk.

Crosstalk in the optical component of the type concerned means that light being transmitted leaks into the receiving side in this side station and enters a light-receiving element in this side station. Particularly, crosstalk ascribable to reflection at an optical interface in the parting area between the receiving path and the transmitting path in this side station or at a proximal end face of the optical fiber is called near-end crosstalk.

In contrast, crosstalk ascribable to reflection at an optical interface in the parting area between the receiving path and the transmitting path in the other side (opponent's) station or at a distal end face of the optical fiber or at the faces of a light-receiving element and light-emitting element in the other side station is called far-end crosstalk. The optical component 10 shown in FIGS. 6A and 6B and the optical transmitter-receiver constructed by combining the optical component 10 with the light-receiving element 22 and the light-emitting element 23 in the illustrated arrangement has been found to have the construction apt to cause especially far-end crosstalk. That is, the previous device described above cannot avoid causing crosstalk. More specifically, it has been found as a result of researching into the cause of such crosstalk that as shown in FIG. 7, since the tilt angles α1 and α2 of the faces (reflective faces) 11d and 11e, respectively relative to the plane X passing through the corner P and the axis 21a of the optical fiber 21 and perpendicular to the plane of the drawing are both set to be relatively large, say at 45°, the light 31 to be received may enter the respective faces 22a and 23a of the light-receiving element 22 and the light-emitting element 23 and the light reflected by these element faces may again follow the path along which it has entered before back into the optical fiber 21 so that it is apt to cause far-end crosstalk in the other side station.

In addition, since the light-receiving element 22 and the light-emitting element 23 are both positioned in direct opposition to the lens 13 and 15, respectively and the centers A22 and A23 of those elements are aligned with the central axes 13a and 15a of the lens 13 and 15, respectively, the previous device are constructed in this respect as well such that the light reflected by these element faces may again follow the path along which it has entered before back into the optical fiber 21, tending to cause far-end crosstalk in the other side station.

SUMMARY OF THE INVENTION

In view of the foregoing situation, it is an object of this invention to provide an optical component for two-way optical communication which is configured to significantly reduce far-end crosstalk, and an optical transmitter-receiver having such optical component incorporated therein.

In accordance with a first aspect of the present invention, an optical component for use in two-way optical communication in which transmission and reception of light are effected through a single optical fiber is provided, the component comprising an optical prism: first and second light-to-be-received condensing lens; and first and second first light-to-be-transmitted condensing lens; the optical prism having a first face opposing an end face of an optical fiber; second and third faces each adjoining the first face at substantially right angles and opposing each other in parallel; a fourth face adjoining the second face and adapted to reflect a light to be received which has entered through the first face and direct it toward the second face; and a fifth face adjoining the third face and adapted to reflect a light to be transmitted which has entered through the third face and direct it toward the first face; the fourth and fifth faces adjoining each other and the junction therebetween being positioned closer to the first face than the junction where the fourth face adjoins the second face and the junction where the fifth face adjoins the third face are. The first and second light-to-be-received condensing lens are formed integrally with the first and second faces, respectively and the first and second light-to-be-transmitted condensing lens are formed integrally with the first and third faces, respectively. In addition, tilt angles of the fourth and fifth faces relative to the axial direction of the optical fiber are selected to be less than 45°.

In accordance with another aspect of the present invention, the tilt angles are selected to be in the range of 30° to 40°.

In accordance with yet another aspect of the present invention, the joint of the fourth face with the first face and the joint of the fifth face with the first face are offset from each other in the axial direction and the two joints are interconnected by a sixth face extending parallel to the axial direction.

In accordance with still another aspect of the present invention, an optical transmitter-receiver for two-way optical communication is provided which comprises: the aforesaid optical component for two-way optical communication; a light-receiving element positioned at a position offset from the center of the frontal face of the second light-to-be-received condensing lens on the second face in the axial direction away from the first face and having a receiving face oriented parallel to the axial direction so as to receive the light to be received which is emitted from the lens on the second face; and a light-emitting element positioned at a position offset from the center of the frontal face of the second light-to-be-transmitted condensing lens on the third face in the axial direction away from the first face and having an emitting face oriented parallel to the axial direction so as to have the light to be transmitted enter the third face.

BRIEF DESCRIPTION OF THE DRAWINGS

FIGS. 1A-1 illustrate one embodiment of the optical component according to this invention and the optical transmitter-receiver utilizing the component, wherein FIG. 1A is a side view looking in the direction A in FIG. 1B.

FIGS. 2A-2E illustrate a modified form of the optical component shown in FIGS. 1A-1B and the optical transmitter-receiver utilizing the same, wherein FIG. 2A illustrates the manner in which light is received through this modified form of the optical component; FIG. 2B is a side view of this modified form of the optical component; FIG. 2C is a front view thereof; and FIG. 2D is a bottom view, and FIG. 2E illustrates the manner in which light is transmitted through this modified form of the optical component;

FIGS. 6A and 6B illustrate a previous optical component according to the technology closest to the present invention and how light is transmitted and received through the component, wherein FIG. 6A is a side view and FIG. 6B is a front view.

DETAILED DESCRIPTION OF THE INVENTION

Figure 6A:
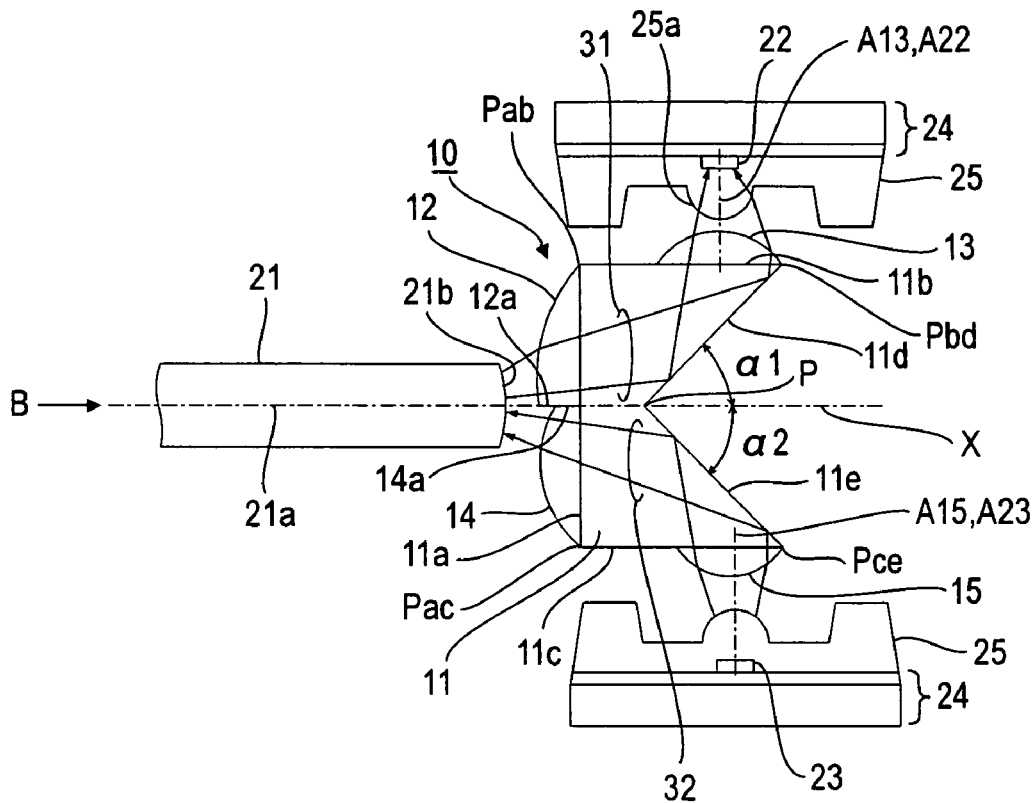
Figure 6B:
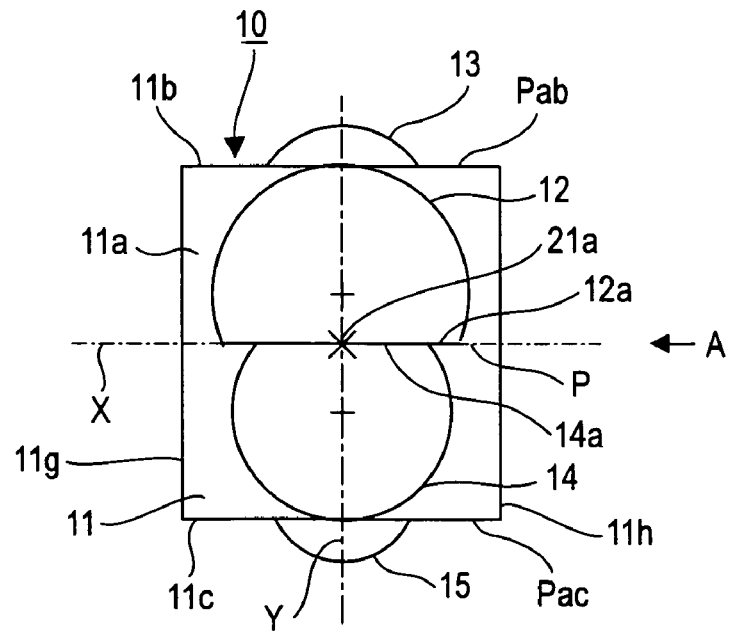
Figure 7:
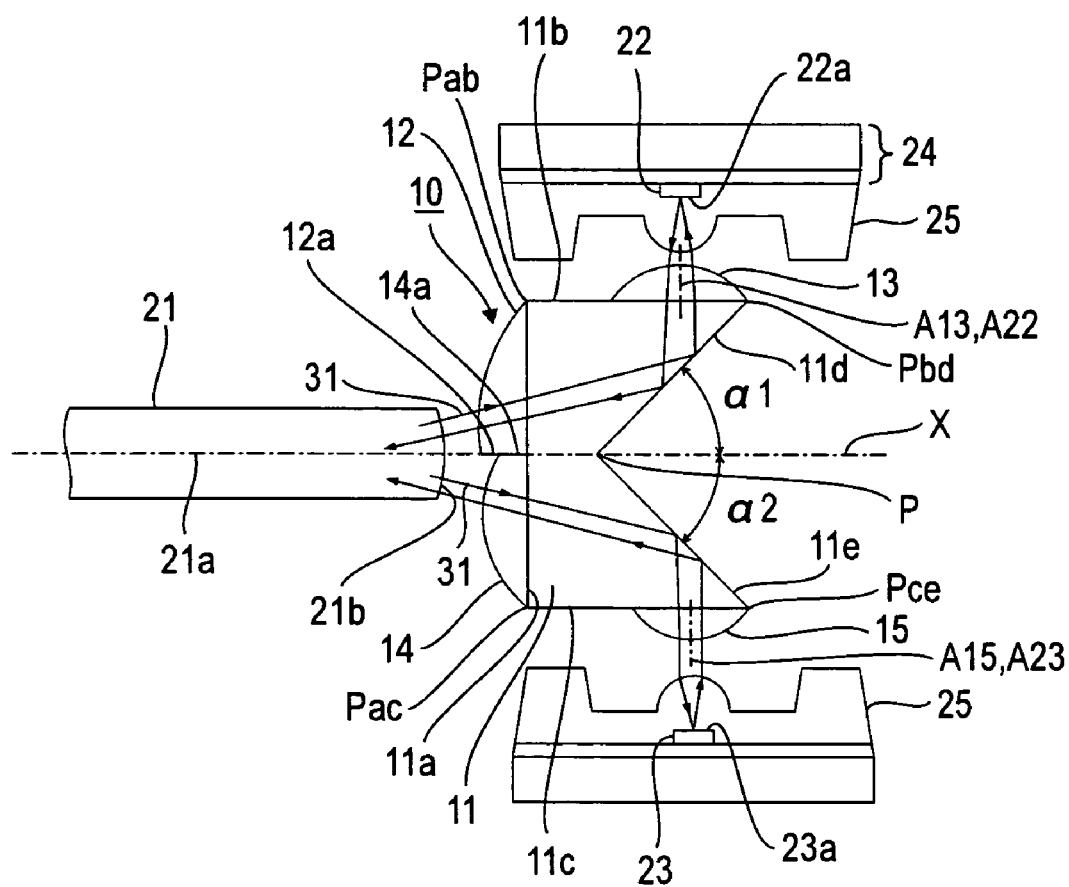
FIG. 7 illustrates the manner in which light to be received is reflected at the element faces of the light-receiving and light-emitting elements in the configuration shown in FIGS. 6A and 6B to thereby cause far-end crosstalk.

Embodiments of this invention will now be described by way of example with reference to the accompanying drawings, in which the parts which correspond to those shown in FIGS. 6A-6B are designated by like reference numerals and will not be discussed again in detail.

Figure 1A:
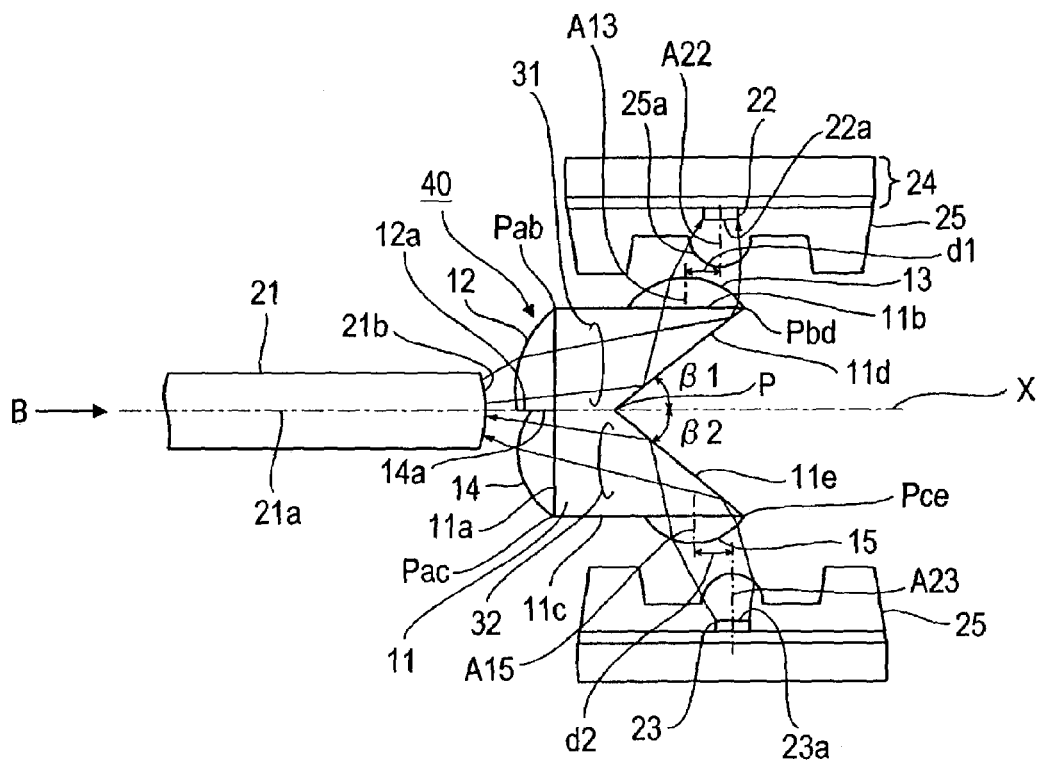
Figure 1B:
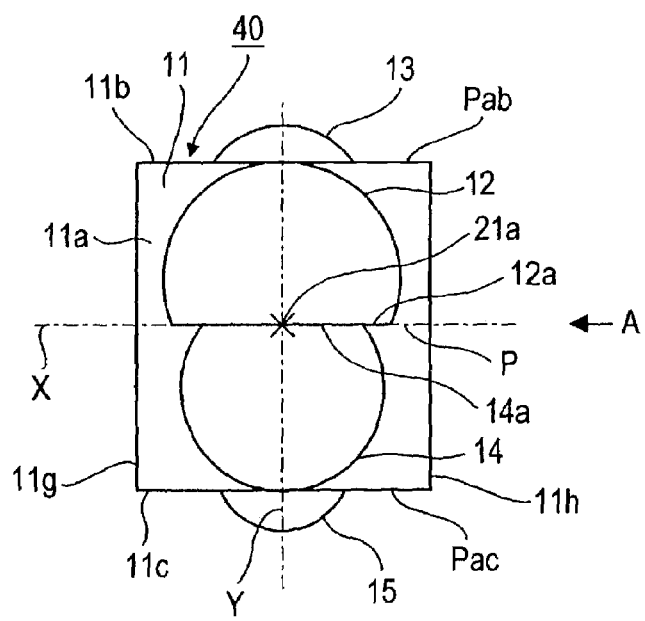
FIG. 1B is a front view looking in the direction B in FIG. 1A.

FIGS. 1A-1B illustrate one embodiment of the optical component 40 for two-way optical communication according to this invention and the optical transmitter-receiver constructed by combining the optical component 40 with a light-receiving element 22 and a light-emitting element 23. In this example, the optical component 40 comprises a prism 11 having a pentagular shape in cross-section generally similar to that of the prism 11 of the optical component 10 shown in FIGS. 6A-6B and having lens 12-15 formed integrally on the faces. In FIG. 1A, the one-dotted chain line indicates an axis 21A of an optical fiber 21 positioned in conjunction with the optical component 40.

The prism 11 of this embodiment differs from that of the previous device in that the tilt angles β1 and β2 which the face 11d constituting a reflective face on the receiving side and the face 11e constituting a reflective face on the transmitting side form with respect to the plane X containing the optical fiber axis 21a, passing through the joint surface between the cut-away surfaces 12a and 14a of the lens 12 and 14, respectively as well as the corner P and perpendicular to the plane of the drawing are both less than those (α1 and α2) of the previous device, that is, set at an angle less than 45°, preferably selected to be in the range of 30° to 40°.

In the embodiment of FIG. 1, the axis 21a of the optical fiber 21 positioned adjacent and in opposition to the lens 12 and 14 on the face 11a of the prism 11 is aligned with a point of intersection between the plane X (shown in a one-dotted chain line in FIG. 1B) passing through the joint (interface) between the lens 12 and 14 and the corner P and perpendicular to the plane of the drawing of FIG. 1A on one hand and the plane Y (shown in a one-dotted chain line in FIG. 1B) passing through the centers of the lens 12, 13, 14 and 15 parallel to the plane of the drawing of FIG. 1A on the other hand, as shown in FIG. 1A and as in the previous device shown in FIG. 6B.

FIGS. 1A-1B illustrate the optical transmitter-receiver constructed by combining the optical component 40 with the light-receiving element 22 and the light-emitting element 23 and the manner in which this optical transmitter-receiver is used to carry out transmission and reception of light.

FIGS. 2A-2E illustrate a modified form 40' of the optical component 40 and an optical transmitter-receiver by combining the optical component 40' with a light-receiving element 22 and a light-emitting element 23 and the manner in which this optical transmitter-receiver is used to carry out transmission and reception of light.

Figure 2A:
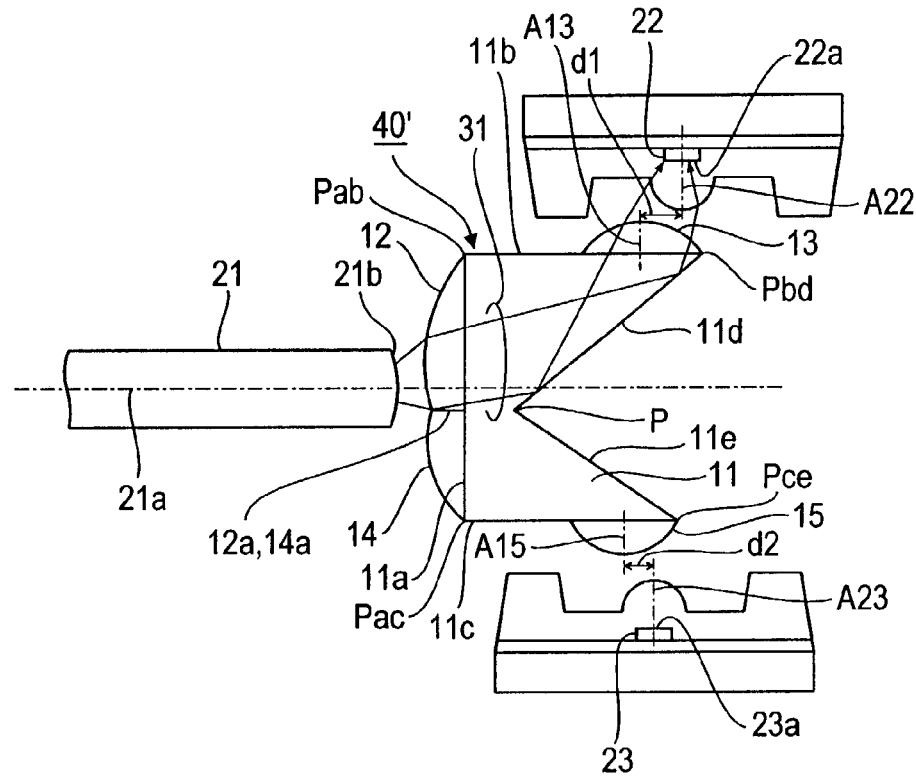
Figure 2B:
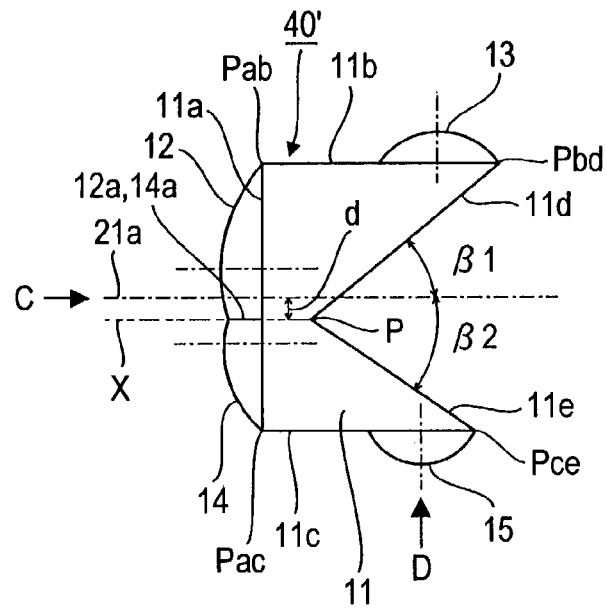

In this modified embodiment, the axis 21a of the optical fiber 21 positioned adjacent and in opposition to the lens 12 and 14 on the face 11a of the prism 11 is aligned with a point offset by a distance d toward the lens 12 from the plane X (shown in a one-dotted chain line in FIG. 2B) passing through the joint (interface) between the cut-away surfaces of the lens 12 and 14 as well as the corner P and perpendicular to the plane of the drawing of FIG. 2A as shown in FIG. 2B, instead of being aligned with the plane X.

While in the previous device the central vertical axis A22 of the light-receiving element 22 is positioned so as to be in alignment with the central axis A13 of the lens 13, it is to be noted in both of the embodiment of FIG. 1 and the modified embodiment of FIG. 2 that the light-receiving element 22 is positioned such that the center A22 of the light-receiving element 22 is offset with respect to the center of the frontal face of the lens 13, that is, the axis A13 of the lens 13 by a distance dl in the direction of the axis 21a in the plane Y away from the face 11a of the prism 11, rather than being aligned with the center of the frontal face of the lens 13.

Similarly, the light-emitting element 23 is also positioned such that the center A23 of the light-emitting element 23 is offset with respect to the axis A15 of the lens 15 by a distance d2 in the direction of the axis 21a in the plane Y away from the face 11a of the prism 11, rather than being aligned with the center of the frontal face of the lens 15.

Further, it should be noted that the light-receiving element 22 and the light-emitting element 23 have their element faces 22a and 23a, respectively both oriented parallel to the axis 21a.

In operation, as shown in FIGS. 1A and 2A, a light 31 to be received which has been emitted from the end face 21b of the optical fiber 21 is collected through the lens 12 prior to entering the prism 11 and is then reflected at the face 11d to be directed at the face 11b, followed by being condensed through the lens 13 before entering the light-receiving element 22. In this regard, since in the present invention the angles β1 and β2 which the reflective faces 11d and 11e, respectively of the prism 11 form with respect to the plane X containing the central axis 21a of the optical fiber 21 are selected to be less than 45°, the light 31 to be received as introduced parallel to the central fiber axis 21a is caused to obliquely enter the element face 22a of the light-receiving element 22, as shown in FIG. 2A.

Similarly, a light 32 to be transmitted which has been emitted from the light-emitting element 23 obliquely enters the lens 15 and is condensed by the lens 15 prior to entering the prism 11 and is then reflected at the face 11e to be directed at the face 11a, followed by being condensed through the lens 14 and finally entering the end face 21b of the optical fiber 21.

It will be appreciated that the optical component 40 or 40' constructed as described above and the optical transmitter-receiver having such optical component incorporated therein and arranged in association with the light-receiving element 22 and the light-emitting element 23 as described above allow for significantly reducing far-end crosstalk which was a problem with the prior art.

Figure 3A:
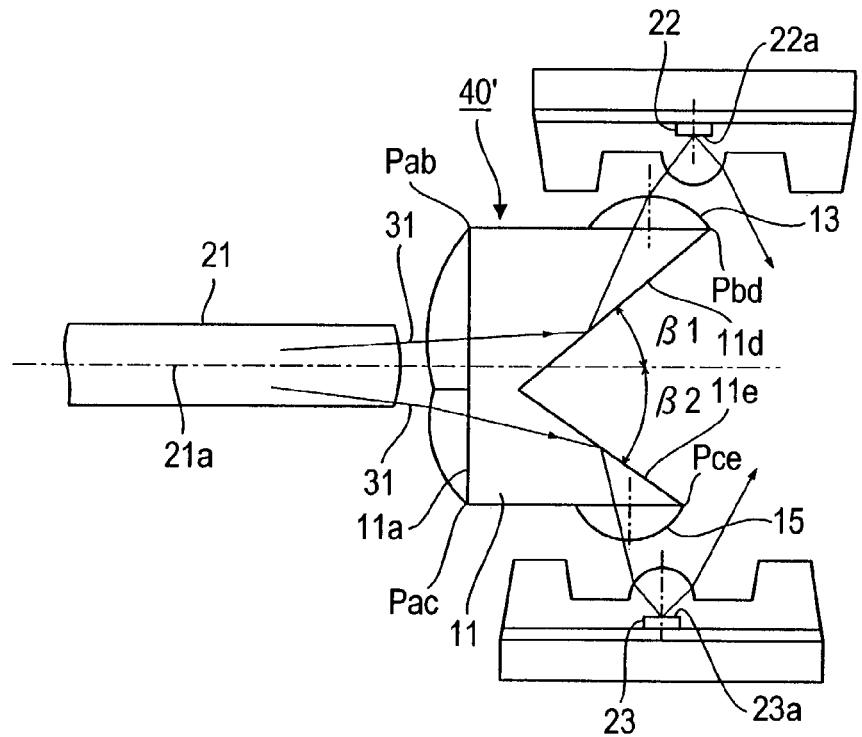
FIG. 3A illustrates the manner in which light being received is reflected at the operative faces of the light-receiving and light-emitting elements in the configuration shown in FIGS. 2A-2E.

Specifically, since the tilt angles β1 and β2 of the faces (reflective faces) 11d and 11e are set to be less than 45°, and more gentle than those (α1=45°, α2=45°) of the previous device, the light 31 to be received as reflected by these reflective faces 11d and 11e will travel rearwardly of the lens 13 and 15 (in a direction away from the face 11a) to obliquely enter the respective faces 22a and 23a of the light-receiving element 22 and the light-emitting element 23 which are located rearward of the lens 13 and 15, as shown in FIG. 3A, so that the light reflected by these element faces 22a and 23a will travel further rearwardly, as shown in FIG. 3A.

Consequently, the path along which the light travels after being reflected at the element faces 22a and 23a is parted from rather than close to the path along which the light has initially entered the prism. That is, the configuration according to this invention prevents the reflected light from again following the path along which it has entered before back into the optical fiber 21 as is the case with the previous device, which otherwise would lead to occurrence of far-end crosstalk. It is thus to be appreciated that this invention provides for significantly reducing far-end crosstalk.

In addition, it should be noted that in the embodiment shown in FIGS. 2A-2E and described above, the configuration is such that the axis 21a of the optical fiber 21 is positioned on the side of the lens 12 and that the area of the opening of the light-receiving path is made larger than the area of the opening of the light-transmitting path so that a greater amount of light 31 to be received may enter the light-receiving element 22. This is an optical arrangement favorable for reception of light.

In this regard, if the light-receiving element 22 and the light-emitting element 23 are changed in position with each other in FIGS. 2A-2E, an optical system favorable for transmission of light may be provided. It may be determined which of the two alternative arrangements should be selected appropriately, taking into account the performance of the light-receiving element 22 and the light-emitting element 23, for example.

While the embodiment and its modified example described above are capable of suppressing far-end crosstalk as compared with the previous device owing to the tilt angles β1 and β2 of the faces 11d and 11e being set to be less than 45°, another embodiment of the optical component which is configured to allow for reducing near-end crosstalk as well as far-end crosstalk will be described with reference to FIGS. 4A and 4B.

Before proceeding with describing the another embodiment, it will be explained with reference to FIG. 3B how near-end crosstalk may occur in the prism 40' in the modified example described above.

Figure 3B:
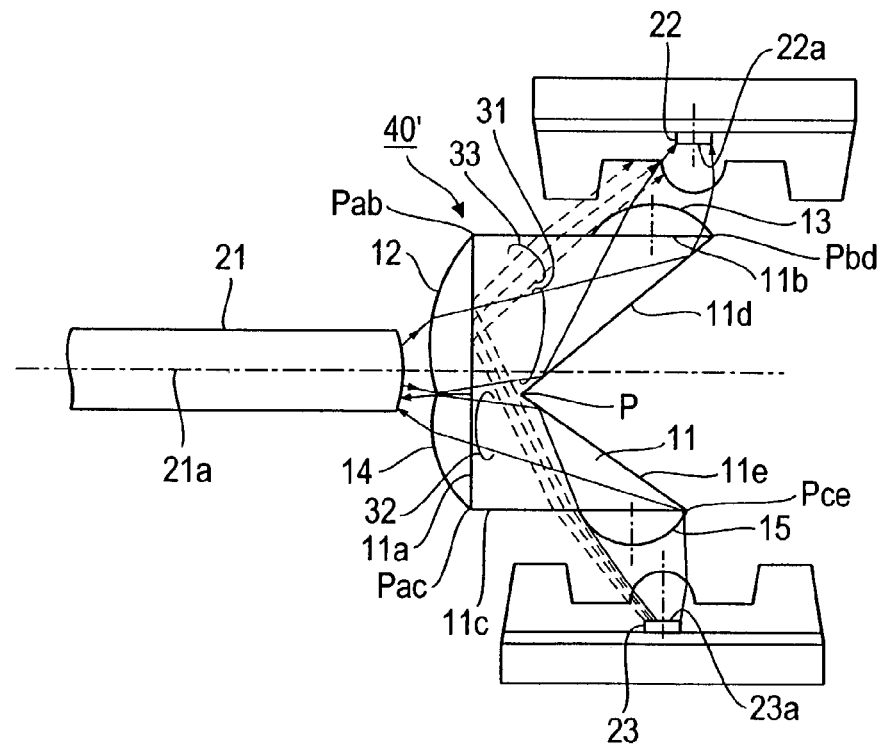
FIG. 3B illustrates the manner in which light to be transmitted reaches the element face of the light-receiving element in the configuration shown in FIGS. 2A-2E to thereby cause near-end crosstalk.

FIG. 3B includes a duplicate of FIG. 2E. If we define an effective transmitting path through which such a portion of the light-to-be-transmitted as emitted from the light-emitting element 23, is reflected at the reflective face 11e and thereafter enters through the face 11a into the optical fiber 21 in FIG. 3B, what is shown as the light-to-be-transmitted 32 in FIG. 2E exactly corresponds to the light passing through that defined effective transmitting path. There is, however, another portion of the light-to-be-transmitted as emitted from the light-emitting element 23 which has missed being collected by the second light-to-be-transmitted converging lens 15 deviates from the effective transmitting path, goes beyond the corner P, interferes directly into the receiving path, and is reflected back by the face 11a and the front side interface of the first light-to-be-received converging lens 12 as a leakage light 33 (shown in dotted lines) which may possibly be received directly into the light-receiving element 22 without either engaging the reflective face 11d or passing through the first light-to-be-received converging lens 13 on the receiving side. This is a cause of near-end crosstalk.

Figure 4A:
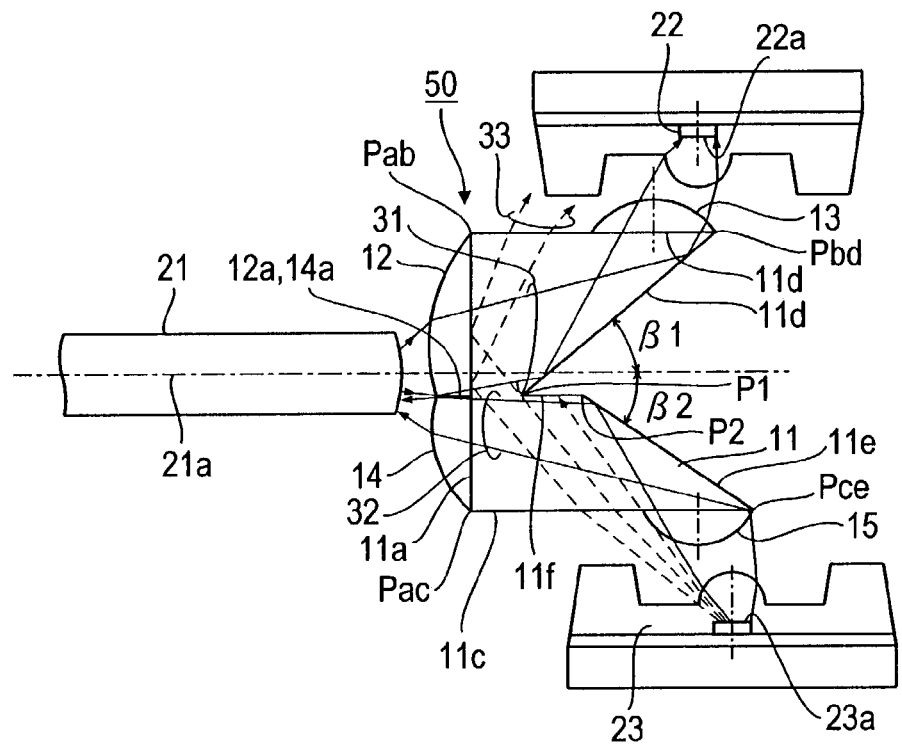
FIGS. 4A and 4B are side views of another embodiment of the optical component according to this invention.

In this regard, an optical component 50 illustrated in FIG. 4A is still another embodiment further improved according to this invention. This optical component 50 is configured such that a face 11d which is a reflective face on the receiving side and a face 11e which is a reflective face on the transmitting side does not define a V-shape therebetween, that is, they do not adjoin each other at a corner P, but instead are offset in the direction of the optical fiber axis 21a. Specifically, in this example, a joint P2 of the face 11e with the face 11a is located at a position spaced apart from a joint P1 of the face 11d with the face 11a in the direction of the optical fiber axis 21a away from the face 11a and the two joints P1 and P2 are interconnected by a sixth face 11f extending parallel to the direction of the optical fiber axis 21a.

With the optical component 50, as will be appreciated if one considers the operation of a device incorporating therein the optical component 50 in substitution for the optical component 40' in FIG. 3B, that portion of the receiving path shaded as viewed from the light-emitting element 23 positioned on the lens 15 side is increased by the provision of the face 11f. Consequently, a portion of the leakage light 33 is prevented from interfering into the receiving path by the corner P1, whereby occurrence of near-end crosstalk and stray light may be correspondingly much more suppressed than the optical components 40 and 40'.

Figure 4B:
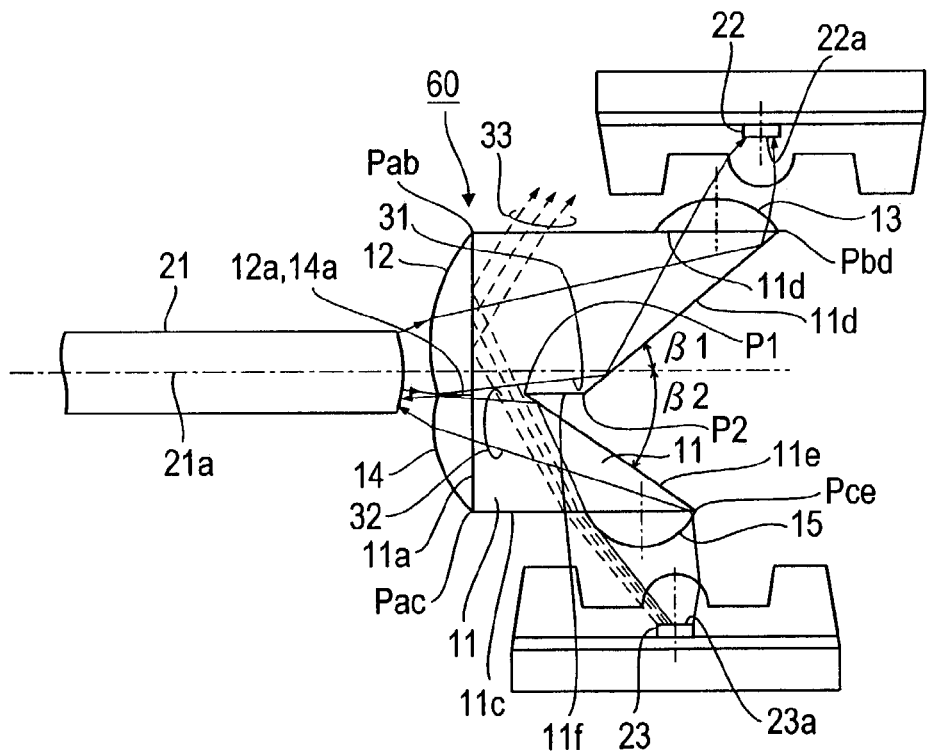

As is opposed to the configuration illustrated in FIG. 4A, FIG. 4B illustrates an optical component 60 configured such that a joint P2 of the face 11e with the face 11a is located at a position closer to the face 11a than a joint P1 of the face 11d with the face 11a in the direction of the optical fiber axis 21a and the two joints P1 and P2 are interconnected by a sixth face 11f extending parallel to the direction of the optical fiber axis 21a.

With this optical component 60, since the light-emitting element is located away from the leakage light 33 which goes beyond the corner P and interferes directly into the effective transmitting path, near-end crosstalk and reception of stray light may be correspondingly suppressed, as is the case with the optical component 50 shown in FIG. 4A.

Figure 5:
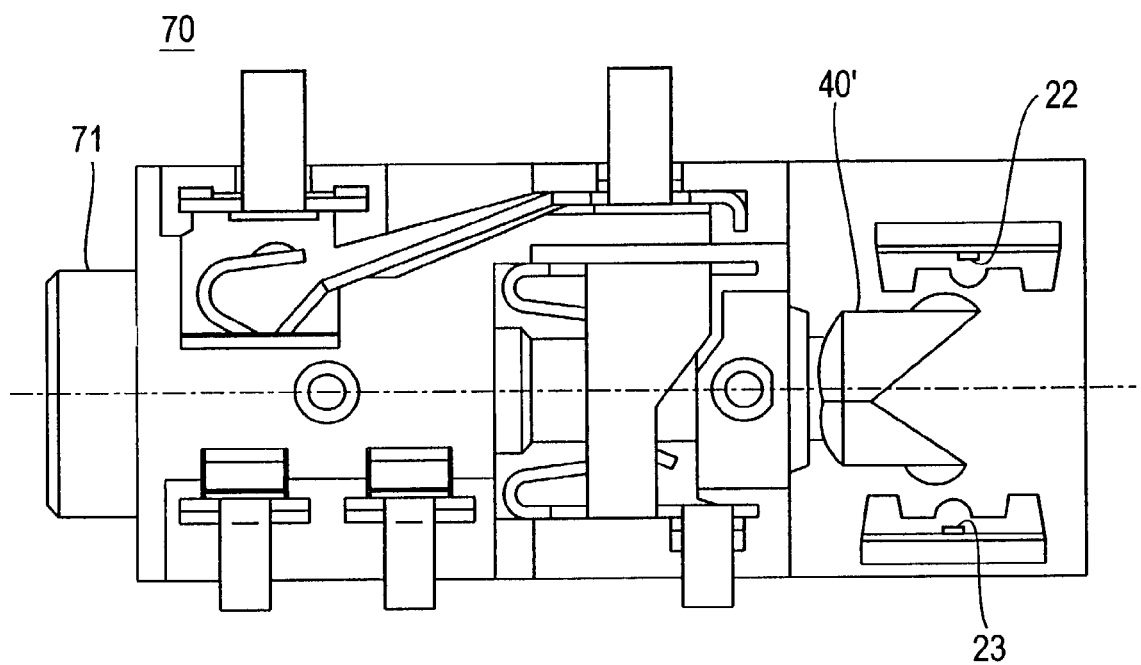
FIG. 5 is a bottom view illustrating the optical component shown in FIGS. 2A-2D being incorporated in an optical connector.

FIG. 5 illustrates an example of a single-core optical connector 70 having incorporated therein an optical transmitter-receiver comprising the optical component 40', the light-receiving element 22 and the light-emitting element 23. In FIG. 5, the reference numeral 71 indicates a sleeve having an optical fiber plug inserted therein.

As is appreciated form the foregoing description, the optical component for two-way optical communication according to this invention allows for significantly reducing far-end crosstalk, and thereby enhancing reliability.

Further, the present invention provides for reducing near-end crosstalk in addition to far-end crosstalk, thereby providing an optical component for two-way optical communication having higher reliability.

What is claimed is:

1. An optical component for use in two-way optical communication in which transmission and reception of light are effected through a single optical fiber, said optical component comprising:

an optical prism;

first and second light-to-be-received condensing lens; and first and second light-to-be-transmitted condensing lens; said optical prism having:

a first face positioned in opposition to an end face of said optical fiber;

second and third faces each adjoining said first face at substantially right angles and opposing each other in parallel;

a fourth face adjoining said second face and adapted to reflect a light-to-be-received which has entered from said optical fiber through said first face toward the second face; and a fifth face adjoining said third face and adapted to reflect a light-to-be-transmitted which has entered from a light source through the third face toward said first face;

said fourth and fifth faces adjoining each other and junction therebetween being positioned closer to said first face than junction between said fourth face and said second face and junction between said fifth face and said third face are;

said first and second light-to-be-received condensing lenses being formed integrally with said first and second faces, respectively;

said first and second light-to-be-transmitted condensing lenses being formed integrally with said first and third faces, respectively; and tilt angles which said fourth and fifth faces form with respect to the axial direction of the optical fiber being selected to be less than 45°.

2. The optical component according to claim 1 wherein said prism further has a sixth face extending parallel to said second and third faces and interconnecting said fourth face and said fifth face.

3. The optical component according to claim 2 wherein said tilt angles are selected to be in the range of 30° to 40°.

4. The optical component according to claim 2 wherein junction between said fourth face and said sixth face is formed at a position closer to said first face than junction between said fifth face and said sixth face is.

5. The optical component according to claim 2 wherein the junction between said fifth face and said sixth face is formed at a position closer to said first face than the junction between said fourth face and said sixth face is.

6. The optical component according to claim 1 wherein said tilt angles are selected to be in the range of 30° to 40°.

7. An optical transmitter-receiver for two-way optical communication comprising:

the optical component for two-way optical communication as set forth in any of claims 1 to 6;

an optical fiber;

a light-receiving element for receiving a light-to-be-received from said optical fiber; and a light-emitting element for emitting a light-to-be-transmitted; axes of all of said lenses and axis of said optical fiber being positioned so as to be contained in a first plane;

said light-receiving element being positioned such that central axis of said light-receiving element is offset from a position where said central axis is linearly aligned in said first plane with axis of said second light-to-be-received condensing lens on said second face by a predetermined distance in the axial direction of said optical fiber away from the first face and that element face of said light-receiving element is parallel to the axial direction of said optical fiber so as to obliquely receive the light-to-be-received as emitted from said second light-to-be-received condensing lens; and said light-emitting element being positioned such that central axis of said light-emitting element is offset from a position where said central axis of the light-emitting element is linearly aligned in said first plane with axis of said second light-to-be-transmitted condensing lens on said third face by a predetermined distance in the axial direction of said optical fiber away from the first face and that element face of said light-transmitting element is parallel to the axial direction of said optical fiber so as to have the light-to-be-transmitted obliquely enter said second light-to-be-transmitted condensing lens.

8. The optical transmitter-receiver according to claim 7 wherein said first light-to-be-received condensing lens and said first light-to-be-transmitted condensing lens formed on said first face have cut-away end surfaces which are joined together to define a joint surface;

said optical fiber being positioned such that its axis coincides at a point of intersection where a second plane containing said joint surface and passing through the junction between said adjoining fourth and fifth faces intersect orthogonally with said first plane.

9. The optical transmitter-receiver according to claim 7 wherein said first light-to-be-received condensing lens and said first light-to-be-transmitted condensing lens formed on said first face have cut-away end surfaces which are joined together to define a joint surface;

said optical fiber being positioned such that its axis coincides at a position displaced in said first plane by a predetermined distance toward said first light-to-be-received condensing lens from a point of intersection where a second plane containing said joint surface and passing through the junction between said adjoining fourth and fifth faces intersect orthogonally with said first plane.

* * * * *